(12) United States Patent
Kobayashi (10) Patent No.: US 8,821,656 B2
(45) Date of Patent: Sep. 2, 2014

(54) VERTICAL HEAT TREATMENT APPARATUS AND HEAT TREATMENT METHOD

(75) Inventor: Takeshi Kobayashi, Nishishirakawa (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 0 days.

(21) Appl. No.: 13/057,632

(22) PCT Filed: Jul. 21, 2009

(86) PCT No.: PCT/JP2009/003392
§ 371 (c)(1),
(2), (4) Date: Feb. 4, 2011

(87) PCT Pub. No.: WO2010/018654
PCT Pub. Date: Feb. 18, 2010

(65) Prior Publication Data
US 2011/0139319 A1    Jun. 16, 2011

(30) Foreign Application Priority Data
Aug. 14, 2008  (JP) .................................. 2008-209070

(51) Int. Cl.
| | |
|---|---|
| *C21D 9/00* | (2006.01) |
| *C30B 11/00* | (2006.01) |
| *C30B 35/00* | (2006.01) |
| *C01B 33/02* | (2006.01) |

(52) U.S. Cl.
USPC ............................ 148/559; 117/204; 423/348

(58) Field of Classification Search
USPC ........... 423/348; 148/559; 266/252; 277/605, 277/608; 285/342, 343; 117/204
See application file for complete search history.

(56) References Cited

U.S. PATENT DOCUMENTS

| | | | | |
|---|---|---|---|---|
| 3,075,793 A | * | 1/1963 | Lennon et al. | ................ 285/342 |
| 5,622,566 A | * | 4/1997 | Hosaka et al. | ......... 118/723 VE |

(Continued)

FOREIGN PATENT DOCUMENTS

| | | |
|---|---|---|
| CN | 1154571 A | 7/1997 |
| CN | 101127298 A | 2/2008 |

(Continued)

OTHER PUBLICATIONS

International Search Report in International Application No. PCT/JP2009/003392; dated Oct. 20, 2009.

(Continued)

*Primary Examiner* — Anthony J Zimmer
(74) *Attorney, Agent, or Firm* — Oliff PLC (57) ABSTRACT

According to the present invention, there is provided a vertical heat treatment apparatus which is a vertical heat treatment furnace comprising at least: a reaction tube; a heat treatment boat configured to hold a substrate; a heater configured to heat the substrate; a gas introduction tube configured to introduce an atmospheric gas into the reaction tube; a gas supply tube connected to the gas introduction tube; and a gas port portion that is formed at a flange body provided under the reaction tube or the reaction tube and into which the gas introduction tube is inserted, wherein the gas introduction tube is connected to the gas supply tube through a joint outside the reaction tube, the joint has at least a metal short tube having a flange portion, and the gas introduction tube is inserted into a through hole formed by connecting the flange portion of the metal short tube to the flange portion provided at the gas port portion through an O-ring and further connected to the gas supply tube through the joint. As a result, there can be provided the vertical heat treatment apparatus that can avoid damages to the gas introduction tube and easily achieve connection between the gas introduction tube and the gas supply tube without haze on a substrate.

8 Claims, 4 Drawing Sheets

(56) References Cited

U.S. PATENT DOCUMENTS

| | | | |
|---|---|---|---|
| 5,927,762 A * | 7/1999 | Webb | 285/123.15 |
| 6,142,773 A * | 11/2000 | Shimazu | 432/241 |
| 6,375,194 B1 | 4/2002 | Peng | |
| 6,407,367 B1 * | 6/2002 | Ito et al. | 219/390 |
| 6,851,729 B2 * | 2/2005 | Gibson | 285/341 |
| 2001/0054386 A1 | 12/2001 | Saito | |
| 2005/0028738 A1 | 2/2005 | Saito et al. | |
| 2006/0258170 A1 | 11/2006 | Saito et al. | |
| 2008/0046111 A1 | 2/2008 | Kataoka et al. | |

FOREIGN PATENT DOCUMENTS

| | | |
|---|---|---|
| JP | A-01-241819 | 9/1989 |
| JP | A-05-090186 | 4/1993 |
| JP | A-7-115068 | 5/1995 |
| JP | A-9-260298 | 10/1997 |
| JP | A-11-135547 | 5/1999 |
| JP | A-2002-009009 | 1/2002 |
| JP | A-2002-289602 | 10/2002 |
| JP | A-2007-266337 | 10/2007 |
| TW | 478071 B | 3/2002 |
| TW | 584920 B | 4/2004 |

OTHER PUBLICATIONS

European Search Report dated Apr. 11, 2012 in European Patent Application No. 09 806 550.1.
Jul. 24, 2012 Office Action issued in Japanese Patent Application No. 2008-209070 (with partial translation).
Jul. 3, 2012 Office Action issued in Chinese Patent Application No. 200980131526.0 (with partial translation).
European Office Action dated Feb. 7, 2013 from European Patent Application No. 09 806 550.1.
Chinese Office Action dated Feb. 8, 2013 from Chinese Patent Application No. 200980131526.0 (with partial English-language translation).
Chinese Office Action dated Aug. 2, 2013 from Chinese Patent Application No. 200980131526.0 (with partial English-language translation).
Taiwanese Office Action dated Jun. 27, 2013 from Taiwanese Patent Application No. 098125109 (with partial English-language translation).
Chinese Search Report dated Feb. 25, 2014 from Chinese Patent Application No. 2009801315260 (with English-language translation).

* cited by examiner

VERTICAL HEAT TREATMENT APPARATUS AND HEAT TREATMENT METHOD

TECHNICAL FIELD

The present invention relates to a heat treatment apparatus configured to perform a heat treatment with respect to a substrate, e.g., a semiconductor silicon wafer.

BACKGROUND ART

Many steps ranging from a substrate manufacturing process to an element forming process are present in a period from slicing a single-crystal ingot of, e.g., semiconductor single crystal silicon (hereinafter, sometimes referred to simply as "a silicon") to obtain a substrate to manufacturing a semiconductor device. As one of such steps, there is a heat treatment step. This heat treatment step is performed for the purpose of forming a defect-free layer at a substrate surface layer, forming a gettering layer based on formation of oxide precipitates, forming an oxide film, diffusing an impurity, and others, and it is a very important process.

As a heat-treating furnace used at such a heat treatment step, e.g., a diffusion furnace used for oxidation or impurity diffusion (an oxidation/diffusion apparatus), a vertical heat-treating furnace that performs a heat treatment with respect to a plurality of substrates at the same time while horizontally holding the substrates is mainly utilized with an increase in diameter of the substrates (see, e.g., Patent Literature 1). In the vertical heat-treating furnace, a heat treatment boat configured to hold a plurality of substrates is usually adopted. Such a heat-treating furnace that performs a heat treatment with respect to a plurality of substrates at the same time is called a batch type heat treatment apparatus.

Figure 3:
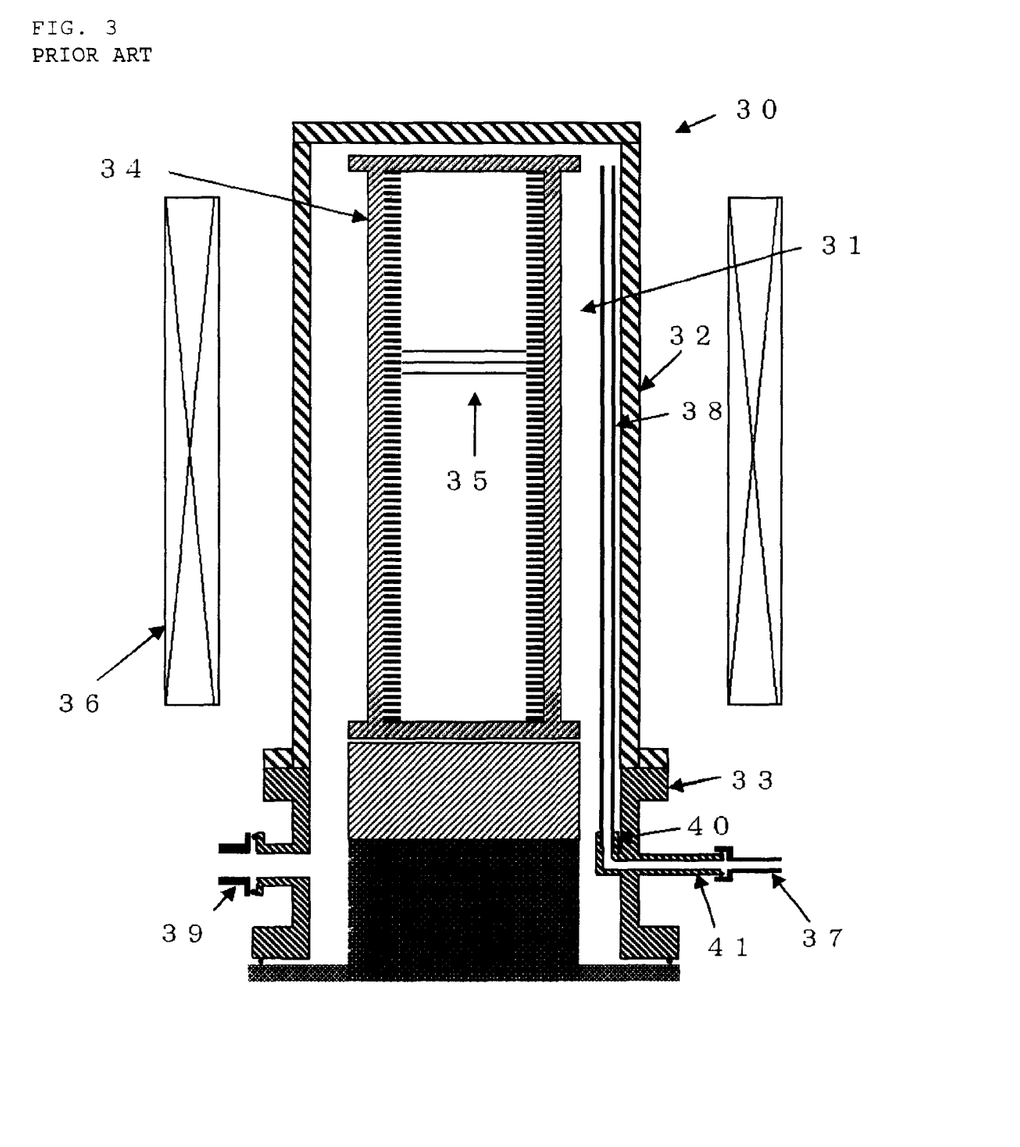
FIG. 3 is a schematic explanatory view showing an example of a conventional batch type vertical heat treatment apparatus.

FIG. 3 is a schematic explanatory view showing an example of a batch type vertical heat treatment apparatus. A reaction chamber 31 of a heat treatment apparatus 30 is mainly constituted of a reaction tube 32 and a flange body 33 provided under the reaction tube. It is to be noted that the reaction tube is made of silicon carbide (SiC) having high heat resistance, and the flange is made of quartz. A heat treatment boat 34 is disposed in the reaction chamber, and a plurality of substrates 35 held by this heat treatment boat are heated by a heater 36 provided around the reaction chamber. Further, an atmospheric gas supplied from a gas supply tube 37 is introduced into the reaction chamber via a gas introduction tube 38, and the gas is flowed from above the heat treatment apparatus to pass around the substrates and is discharged to the outside from a gas discharge tube 39.

As a material of this gas introduction tube 38, silicon carbide is used. That is because, when the gas introduction tube 38 is made of quartz, performing a heat treatment at a high temperature of approximately 1250° C. causes thermal deformation of the gas introduction tube, resulting in a problem that the introduction tube comes into contact with the heat treatment boat 34 to be destroyed. Therefore, in a heat treatment apparatus that performs high-temperature heat treatments at 1250° C. or above, a gas introduction tube made of silicon carbide is exclusively used.

Such a gas introduction tube 38 is connected to a gas port portion 41 at a connecting portion 40, and the gas port portion is connected to the gas supply tube 37 connected to a non-illustrated gas supply source. It is to be noted that, since the gas port portion has a complicated configuration and is hardly fabricated by using silicon carbide, quartz that facilitates fabrication is adopted. At this time, although the atmospheric gas to be used differs depending on a purpose of a heat treatment, $H_2$, $N_2$, $O_2$, or Ar is principally utilized. Furthermore, in case of impurity diffusion, each of these gases is used as a carrier gas to introduce an impurity compound gas.

However, when the above-described batch type heat treatment apparatus is utilized to perform a heat treatment for a silicon wafer as a substrate under an inert gas atmosphere of, e.g., Ar, there occurs a problem that haze is generated on the silicon wafer.

CITATION LIST

Patent Literature 1: Japanese Unexamined Patent publication (kokai) No. 2002-289602

DISCLOSURE OF INVENTION

A cause of the above-described problem lies in that air that has leaked from a gap between the reaction tube and the flange body provided under the reaction tube enters the gas introduction tube from the connecting portion of the gas introduction tube and oxygen contained in the air forms an oxide film on a substrate surface that is being subjected to a heat treatment.

Figure 4:
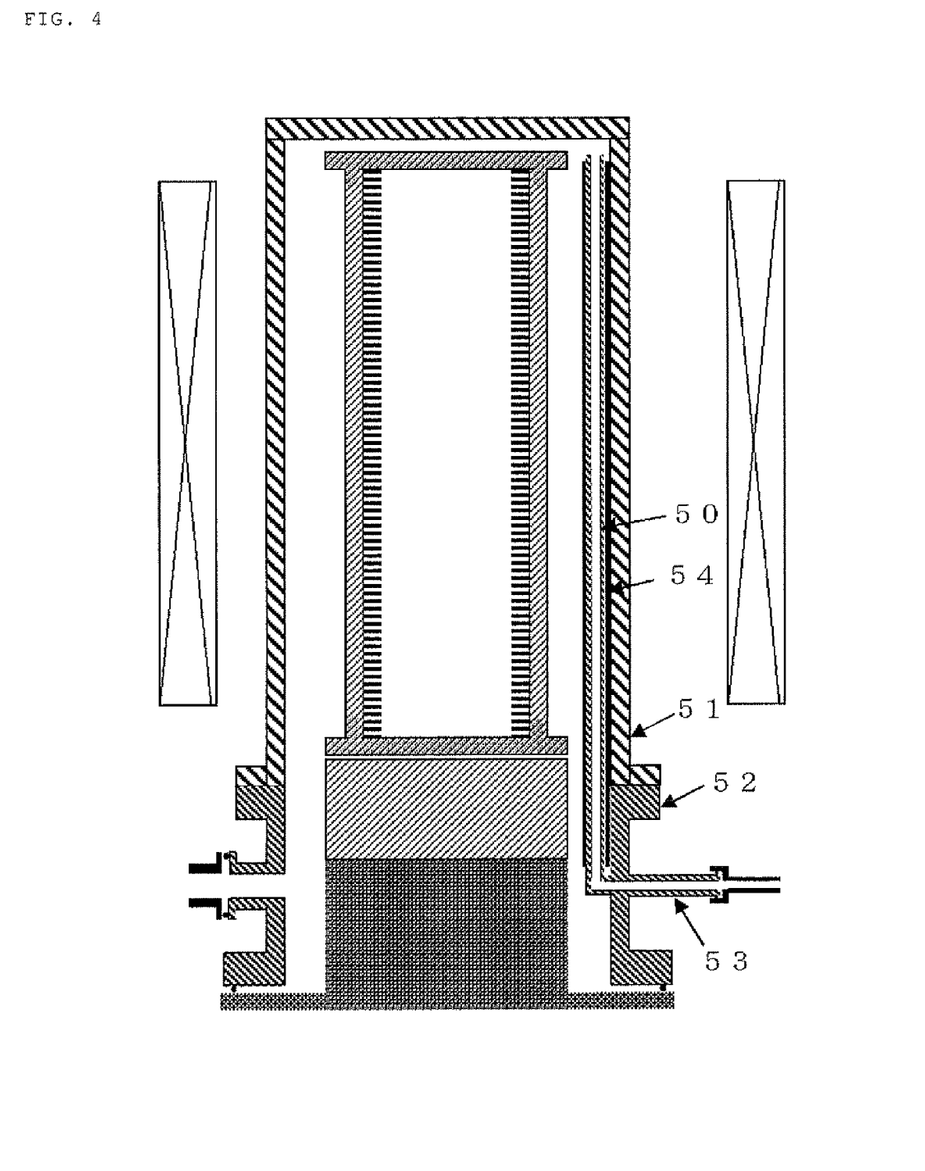
FIG. 4 is a schematic explanatory view showing an example of a vertical heat treatment apparatus in which a reaction tube made of silicon carbide is connected to a quartz flange body having a gas port portion and a gas introduction tube integrated to each other and a protective tube made of silicon carbide is attached.

In regard to such a problem, the present inventor proposed a heat treatment apparatus that solves the problem of haze (an oxide film) of the substrate by applying a gas introduction tube 50 made of quartz and welding the gas introduction tube 50 to a gas port portion 53 formed at a reaction tube 51 or a flange body 52 provided under the reaction tube to eliminate a connecting portion and to prevent air from entering and that solves the deformation of the quartz gas introduction tube due to heat by covering the gas introduction tube with a protective tube 54 made of SiC as shown in FIG. 4. However, there occurred a problem that, when the gas introduction tube is welded to the gas port portion formed at the reaction tube or the flange body provided under the reaction tube in this manner, the gas introduction tube is damaged when handling the reaction tube or the flange body.

Thus, in view of the above-described problem, it is an object of the present invention to provide a vertical heat treatment apparatus that can avoid damage to a gas introduction tube and enable easily connecting a gas introduction tube to a gas supply tube without causing haze on a substrate.

To achieve this object, according to the present invention, there is provided a vertical heat treatment apparatus comprising at least: a reaction tube; a heat treatment boat that is arranged in the reaction tube and holds a substrate; a heater configured to heat the substrate; a gas introduction tube configured to introduce an atmospheric gas into the reaction tube; a gas supply tube connected to the gas introduction tube; and a gas port portion that is formed at a flange body provided under the reaction tube or the reaction tube and into which the gas introduction tube is inserted, wherein the gas introduction tube is connected to the gas supply tube through a joint outside the reaction tube, the joint has at least a metal short tube having a flange portion, the flange portion of the metal short tube is connected to a flange portion provided at the gas port portion through an O-ring, and the gas introduction tube is inserted into a through hole formed by connecting the metal short tube to the gas port portion and further connected to the gas supply tube through the joint.

As described above, according to the vertical heat treatment apparatus of the present invention, the flange portion of the gas port portion is connected to the flange portion of the metal short tube through the O-ring without welding the gas introduction tube to the reaction tube or the flange body provided under the reaction tube, and the gas introduction tube is inserted into the through hole formed by connecting the metal short tube to the gas port portion and further connected to the gas supply tube through the joint. Therefore, the gas introduction tube is not integrated with the reaction tube or the flange body, the gas introduction tube can be prevented from being accidentally damaged when handling the reaction tube or the flange body, and the flange portion of the gas port portion is connected to the flange portion of the metal short tube through the O-ring, thereby easily connecting the gas introduction tube to the gas supply tube. Furthermore, since the connecting portion between the gas introduction tube and the gas port portion is not provided in the reaction tube as different from conventional examples, oxygen can be prevented from entering the gas introduction tube, and haze (the oxide film) is not generated on the substrate.

Further, it is preferable that the joint further comprises a sleeve and a nut in addition to the metal short tube, the sleeve is disposed to an end portion of the gas supply tube, an inside diameter of the sleeve is larger than an outside diameter of the gas introduction tube and an outside diameter of the sleeve is larger than an outside diameter of the end portion of the gas supply tube, the nut is engaged with the sleeve by insertion of the gas supply tube through the nut, a thread groove is formed on an inner periphery of the other end of the nut, the thread groove is screwed to an outer peripheral thread groove formed on an opposite side of the flange portion of the metal short tube connected to the flange portion of the gas port portion, an end portion of the metal short tube on the opposite side of the flange portion thereof receives the sleeve through an O-ring to be fitted, the sleeve receives the gas introduction tube to be fitted, the sleeve engaged with the nut is bonded to the metal short tube side through the O-ring under pressure by screwing the nut to the metal short tube, and the gas supply tube is thereby connected to the gas introduction tube while keeping airtightness.

If the gas introduction tube is connected to the gas supply tube based on pressure bonding of the sleeve with respect to the metal short tube side through the O-ring by screwing the nut to the metal short tube, the gas introduction tube is more easily connected to the gas supply tube, thereby enhancing airtightness of the connecting portion.

Furthermore, a material of the gas port portion can be quartz, a material of the gas introduction tube can be quartz, silicon carbide, or silicon, and a material of the reaction tube can be silicon carbide.

The gas port portion having a complicated shape can be easily processed when the material of the gas port portion is quartz as described above, and the reaction tube can be prevented from being deformed even during a heat treatment at a high temperature when the material of the reaction tube is silicon carbide. When the material of the gas introduction tube is quarts, silicon carbide, or silicon, the processing can be facilitated and the substrate cannot be contaminated with a metal and others.

Moreover, a material of the gas introduction tube can be quartz, and the gas introduction tube can be covered with a protective tube made of silicon carbide.

When the material of the gas introduction tube is quartz, covering the gas introduction tube with the protective tube made of silicon carbide enables preventing the gas introduction tube from being thermally deformed by a heat treatment effected at a higher temperature of 1250° C. or above.

Additionally, when such a vertical heat treatment apparatus is utilized to perform a heat treatment with respect to a silicon wafer in a temperature range of 1000 to 1350° C., haze can be prevented from generating on the silicon wafer.

As described above, according to the heat treatment apparatus of the present invention, the flange portion of the gas port portion is connected to the flange portion of the metal short tube through the O-ring without welding the gas introduction tube to the reaction tube or the flange body provided under the reaction tube, and the gas introduction tube is inserted into the through hole formed by connecting the metal short tube to the gas port portion and connected to the gas supply tube through the joint, whereby the gas introduction tube is not integrated with the reaction tube or the flange body and the gas introduction tube can be prevented from being accidentally damaged when handling the reaction tube or the flange body. Moreover, the configuration that the flange portion of the gas port portion is connected to the flange portion of the metal short tube through the O-ring enables easily connecting the gas introduction tube to the gas supply tube. Additionally, the connecting portion between the gas introduction tube and the gas port portion is not provided in the reaction tube, thereby obtaining the heat treatment apparatus that prevents oxygen from entering the gas introduction tube and avoids haze on the substrate.

BEST MODE FOR CARRYING OUT THE INVENTION

The present invention will now be more specifically explained hereinafter.

As described above, when a heat treatment is performed with respect to a substrate for various purposes, e.g., quality improvement, haze is generated on the substrate. It is considered that a cause of this haze lies in that air leaking from a gap between a reaction tube and a flange body enters a gas introduction tube from a joint portion between the gas introduction tube and a gas port portion to form an oxide film on a substrate surface that is being subjected to the heat treatment. The problem of haze on the substrate is solved by a countermeasure, i.e., applying the gas introduction tube made of quartz, welding the gas introduction tube to the gas port portion formed at the reaction tube or the flange body provided under the reaction tube to eliminate a connecting portion, and further attaching a protective tube made of silicon carbide to avoid deformation due to heat. However, since the long gas introduction tube is welded to the gas port portion formed at the reaction tube or the flange body provided under the reaction tube, the gas introduction tube is often damaged when handling the flange at the time of assembling or disassembling a heat treatment apparatus.

Thus, the present inventor embarked on development of a heat treatment apparatus that does not cause haze on a substrate and does not damage a gas introduction tube at the time of assembling and disassembling. As a result, the present inventor discovered that damages to the gas introduction tube can be avoided and haze on a wafer due to leakage can be prevented from generating by adopting a configuration that; the gas introduction tube is connected to a gas supply tube through a joint outside a reaction tube, the joint has at least a metal short tube having a flange portion, the flange portion of the metal short tube is connected to a flange portion provided at the gas port portion through an O-ring, and the gas introduction tube is inserted into a through hole formed by connecting the metal short tube to the gas port portion and thereby connected to the gas supply tube through the joint.

An embodiment of a heat treatment apparatus according to the present invention will now be described hereinafter with reference to the accompanying drawings, but the present invention is not restricted thereto.

Figure 1:
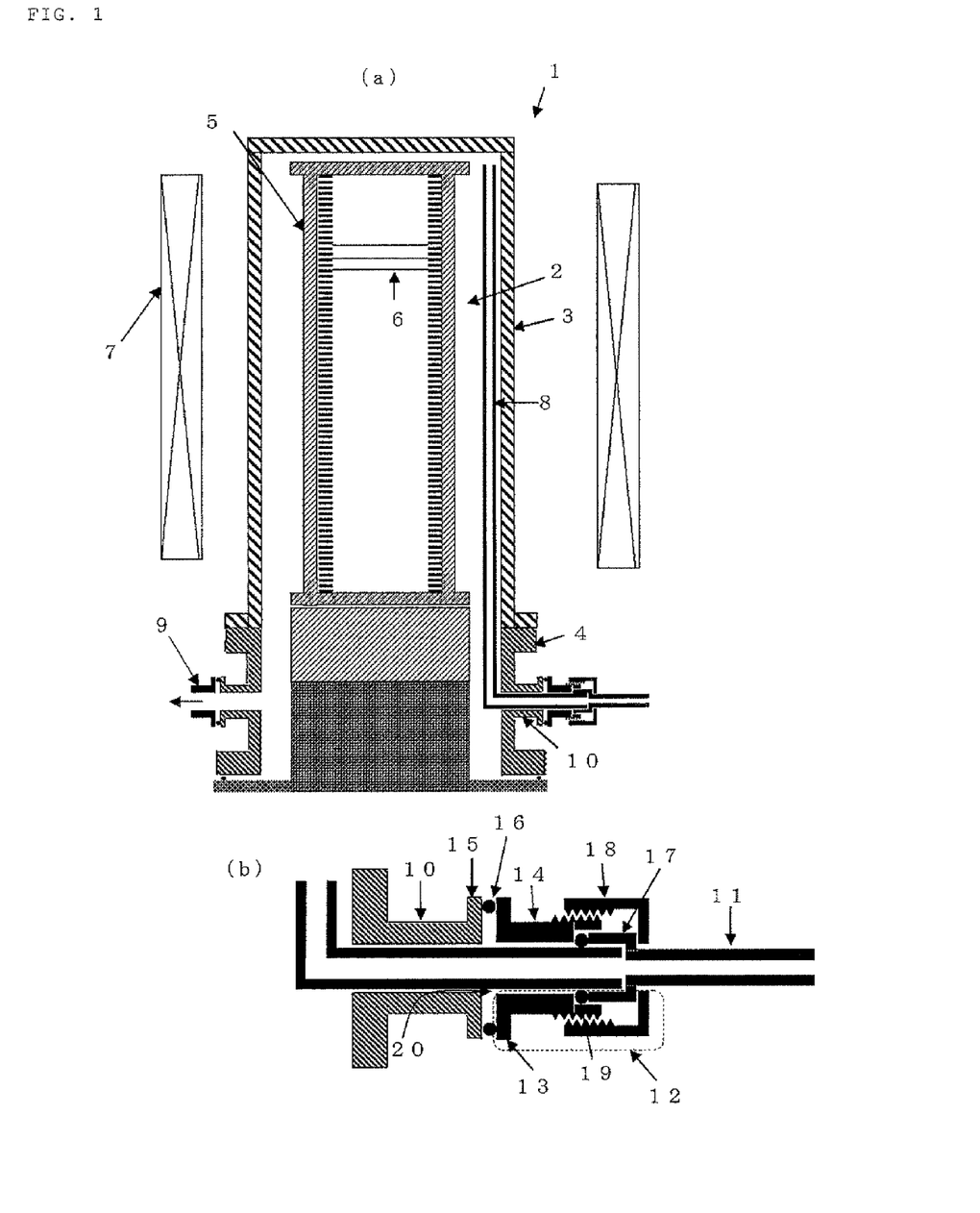
FIG. 1 is a schematic explanatory view showing an example of a vertical heat treatment apparatus according to the present invention.

FIG. 1 is a schematic explanatory view showing an example of a heat treatment apparatus according to the present invention. As shown in FIG. 1(a), a vertical heat treatment apparatus according to the present invention has a configuration that a reaction chamber 2 is constituted of a reaction tube 3 and a flange body 4 provided under the reaction tube in a heat treatment apparatus 1. Further, a heat treatment boat 5 is arranged in the reaction tube, and substrates 6 are held by this heat treatment boat. Furthermore, a heater 7 configured to heat the substrates is provided around the reaction chamber. A gas introduction tube 8 configured to supply an atmospheric gas and a gas discharge tube 9 configured to discharge the gas are provided in the reaction chamber. Moreover, a gas port portion 10 is formed at the flange body when the flange body and the reaction tube are separately configured, and the same is directly formed at the reaction tube when the reaction tube and the flange body are integrally formed.

Here, in the present invention, as shown in FIG. 1(b), a gas supply tube 11 is connected to the gas introduction tube 8 through a joint 12 on the outer side of the reaction tube 3. The joint 12 includes at least a metal short tube 14 having a flange portion 13. When a flange portion 15 provided at the gas port portion 10 is connected to the flange portion 13 of this metal short tube through an O-ring 16, a through hole 20 having substantially the same diameter from the gas port portion 10 to the metal short tube 14 is formed. A horizontal portion of the L-shaped gas introduction tube 8 is inserted into this through hole 20 and connected to the gas supply tube 11 through the joint 12.

In the vertical heat treatment apparatus according to the present invention, the flange portion 15 of the gas port portion 10 is connected to the flange portion 13 of the metal short tube 14 through the O-ring 16 without welding the gas introduction tube 8 to the reaction tube 3 or the flange body 4 provided under the reaction tube, and the gas introduction tube 8 is inserted into the through hole 20 formed by connecting the metal short tube 14 to the gas port portion 10 and connected to the gas supply tube 11 through the joint 12, thereby easily connecting the gas supply tube 11, the gas introduction tube 8, and the flange body 4 to enable attachment/detachment of the gas introduction tube 8. Additionally, in the conventional heat treatment apparatus, since the inside of the reaction tube cannot be seen at the time of, e.g., attachment of the reaction tube, the gas introduction tube comes into contact with the reaction tube, and the gas introduction tube is damaged. However, in the vertical heat treatment apparatus according to the present invention, since the gas introduction tube 8 can be fixed after attaching the reaction tube 3 to the flange body 4, the gas introduction tube 8 is not damaged at the time of assembling or disassembling of the apparatus. Further, the connecting portion between the gas introduction tube and the gas port portion is present in the reaction tube and air leaking from a gap between the reaction tube and the flange body enters the gas introduction tube from the connecting portion to generate an oxide film on a substrate surface that is being subjected to a heat treatment in the conventional heat treatment apparatus, but the connecting portion between the gas introduction tube and the gas supply tube is present outside the reaction tube in the heat treatment apparatus according to the present invention, whereby haze is not generated on the substrate.

It is to be noted that the heat treatment apparatus having the reaction tube 3 made of silicon carbide (SiC) having high heat resistance and the gas port portion 10 made of quartz is preferable. A reason why the reaction tube is made of silicon carbide in this manner is that the reaction tube made of quartz may be possibly deformed when used at a high heat treatment temperature of, e.g., 1250° C. or above, but the reaction tube may be made of quartz when used at a low temperature. In this case, the flange body 4 does not have to be provided in particular, the reaction tube and the flange body may be integrally made of quartz. Furthermore, it is preferable to adopt quartz as a material of the flange body 4 including the gas port portion 10 since its configuration is complicated, but the flange body 4 may be made of not only quartz but also silicon carbide, and the reaction tube and the flange body may be integrally formed by using silicon carbide.

Figure 2:
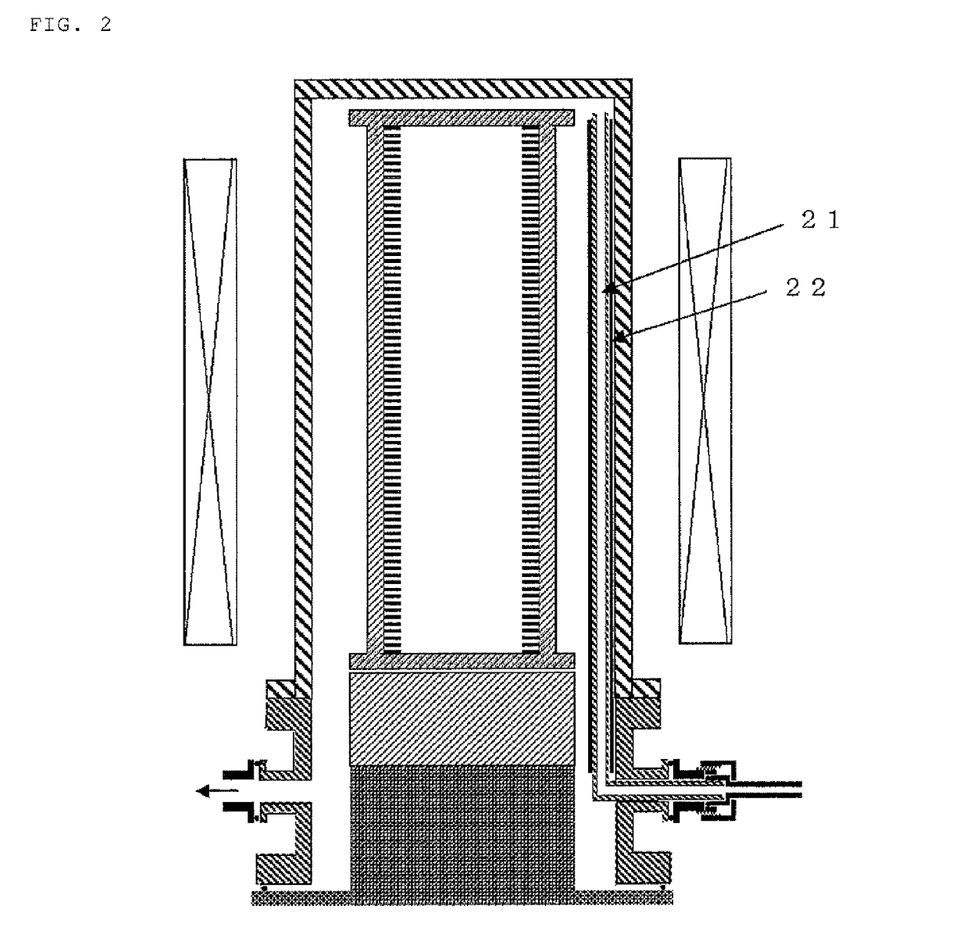
FIG. 2 is a schematic explanatory view showing an example of a vertical heat treatment apparatus according to the present invention in which a gas introduction tube is covered with a protective tube made of silicon carbide when the gas introduction tube is made of quartz.

Moreover, as a material of this gas introduction tube 8, quartz, silicon carbide, or silicon can be used. However, when the gas introduction tube is made of quartz, it may be possibly deformed when subjected to a high-temperature heat treatment, and hence thermal deformation can be avoided by covering the quartz gas introduction tube 21 with a protective tube 22 as shown in FIG. 2. It is preferable for this protective tube to be made of any one of silicon carbide, silicon carbide subjected to CVD coating using silicon carbide, silicon subjected to CVD coating using silicon carbide, and carbon subjected to CVD coating using silicon carbide. Since these materials have resistance against thermal deformation as compared with quartz, they can assuredly avoid troubles, e.g., contact of the gas introduction tube with respect to the heat treatment boat or the reaction tube due to thermal deformation. Additionally, when a slit is formed at a side surface of the protective tube, CVD coating in the protective tube can be more assuredly performed, which is more preferable.

The joint that connects the gas introduction tube with the gas supply tube will now be described in more detail with reference to FIG. 1(b). FIG. 1(b) is an enlarged view of the joint that connects the gas introduction tube and the gas supply tube in FIG. 1(a) to each other.

The joint 12 according to the present invention includes the metal short tube 14, a sleeve 17, and a nut 18. The sleeve 17 is made of a metal, welded to an end of the gas supply tube 11, and has an inside diameter larger than an outside diameter of the gas introduction tube 8 and an outside diameter larger than an outside diameter of an end portion of the gas supply tube 11. The nut 18 has on one end surface at the center thereof a small hole whose inside diameter is larger than the outside diameter of the gas supply tube and smaller than the outside diameter of the sleeve, and it is engaged with the sleeve 17 by insertion of the gas supply tube through the nut. A thread groove is formed on an inner periphery at the other end of this nut 18, and this thread groove is screwed to an outer peripheral thread groove formed on the opposite side of the flange portion 13 of the metal short tube 14 connected to the flange portion 15 of the gas port portion 10. Further, an inside diameter of the metal short tube 14 is slightly larger than the outside diameter of the gas introduction tube 8, an inside diameter of an end portion of the metal short tube 14 on the opposite side of the flange portion 13 of the metal short tube 14 is slightly larger than the outside diameter of the sleeve 17, and an O-ring 19 is disposed at a step portion where the diameter varies. The end portion on the opposite side of the flange portion 13 of the metal short tube 14 receives the sleeve 17 through this O-ring 19 to be fitted therein, and the sleeve 17 receives the gas introduction tube 8 to be fitted therein. In the present invention, to connect the gas introduction tube 8 to the gas supply tube 11, the flange portion 15 of the gas port portion 10 is connected to the flange portion 13 of the metal, short tube 14 through the O-ring 16, the gas introduction tube 8 is inserted from the reaction chamber side into the through hole 20 formed by connecting the metal short tube 14 to the gas port portion 10, and it is disposed in such a manner that an end portion thereof protrudes from at least the O-ring 19. Then, the sleeve 17 engaged with the nut 18 is bonded to the metal short tube side through the O-ring 19 under pressure by screwing the nut 18 to the metal short tube 14, thereby connecting the gas supply tube to the gas introduction tube while keeping airtightness.

The gas supply tube can be more easily connected to the gas introduction tube by using the joint having such a configuration, and adopting the O-ring enables enhancing the airtightness of the connecting portion. Furthermore, the joint is not restricted to such a configuration, and any other configuration may be adopted as long as the metal short tube, the gas introduction tube, and the gas supply tube can be connected while keeping the airtightness.

Moreover, when the above-described heat treatment apparatus according to the present invention is utilized to perform a heat treatment in a temperature range of 1000 to 1350° C. and a silicon wafer is used as a substrate, haze can be prevented from generating on the silicon wafer.

EXAMPLE

The present invention will now be more specifically explained hereinafter based on an example and comparative example, but the present invention is not restricted thereto.

Example

In such a vertical heat treating furnace as shown in FIG. 1 having a configuration that a silicon carbide reaction tube and a quartz flange body provided under the reaction tube are provided and a gas port portion was formed at the flange body, a flange portion of a metal short tube including an SUS straight tube and the SUS flange portion was connected to a flange portion of the gas port portion through an O-ring. A quartz gas introduction tube having a silicon carbide protective tube previously attached thereto as shown in FIG. 2 was inserted into a through hole formed by connecting the metal short tube to the gas port portion in this manner, an O-ring was attached to the gas introduction tube exposed from an end portion of the metal short tube, an argon gas supply tube was fitted through this O-ring, and a nut was screwed to the metal short tube to bond a sleeve engaged with the nut to the metal short tube side through an O-ring under pressure, whereby the gas introduction tube was connected to the gas supply tube while keeping the airtightness. In this state, argon gas was supplied into the reaction tube, and a heat treatment was performed with respect to a silicon wafer having a diameter of 300 mm at 1200° C. for one hour. A Haze value obtained when measuring a surface of the annealed silicon wafer by using SP-1 manufactured by KLA TENCOR CORPORATION under a high-throughput condition in a DWN mode was 0.06 ppm, and surface roughness did not occur. Additionally, the gas introduction tube was not damaged even though a heat treatment jig was assembled many times in apparatus maintenance.

Comparative Example 1

A silicon carbide gas introduction tube was connected to a gas port portion of a quartz flange body provided under a silicon carbide reaction tube in a reaction chamber as shown in FIG. 3 to supply argon gas into the reaction tube, and a heat treatment was performed with respect to a silicon wafer having a diameter of 300 mm at 1200° C. for one hour. However, a Haze value of a wafer surface was 0.5 ppm or above, and intensive surface roughness occurred. It can be considered that this result was obtained since air leaking from a connecting portion between the silicon carbide reaction tube and the flange body was mixed into argon gas in the gas introduction tube from a connecting portion between the gas port portion and the silicon carbide gas introduction tube.

Comparative Example 2

As shown in FIG. 4, a silicon carbide reaction tube was connected to a quartz flange body in which a gas port portion is integrated with a gas introduction tube having a silicon carbide protective tube previously attached thereto, and a heat treatment was performed with respect to a silicon wafer having a diameter of 300 mm at 1200° C. for one hour while argon gas was supplied into the reaction tube, resulting in that a Haze value of a wafer surface was 0.06 ppm and no surface roughness occurred. However, after the reaction tube was removed at the time of apparatus maintenance and the maintenance was carried out, the reaction tube was brought into contact with the gas introduction tube to damage the gas introduction tube when moving down and attaching the reaction tube to insert the gas introduction tube into the reaction tube.

It is to be noted that the present invention is not restricted to the foregoing embodiment. The foregoing embodiment is just an exemplification, and any examples that have substantially the same configuration and exercise the same functions and effects as the technical concept described in claims of the present invention are included in the technical scope of the present invention.

The invention claimed is:
1. A vertical heat treatment apparatus comprising at least: a reaction tube; a heat treatment boat that is arranged in the reaction tube and holds a substrate; a heater configured to heat the substrate; a gas introduction tube configured to introduce an atmospheric gas into the reaction tube; a gas supply tube connected to the gas introduction tube; and a gas port portion that is formed at a flange body provided under the reaction tube and into which the gas introduction tube is inserted,
wherein the gas introduction tube is L-shaped, the gas port portion is tube-shaped, the gas introduction tube is connected to the gas supply tube through a joint outside the reaction tube, the joint has at least a metal short tube having a flange portion, the flange portion of the metal short tube is connected to a flange portion provided at the gas port portion through an O-ring, and a horizontal portion of the L-shaped gas introduction tube is inserted into a through hole formed by connecting the metal short tube to the gas port portion and thereby the gas introduction tube is connected to the gas supply tube through the joint, and a material of the flange body including the gas port portion is quartz, a material of the gas introduction tube is quartz, silicon carbide, or silicon, and a material of the reaction tube is silicon carbide.

2. The vertical heat treatment apparatus according to claim 1, wherein the joint further comprises a sleeve and a nut in addition to the metal short tube, the sleeve is disposed to an end portion of the gas supply tube, an inside diameter of the sleeve is larger than an outside diameter of the gas introduction tube and an outside diameter of the sleeve is larger than an outside diameter of the end portion of the gas supply tube, the nut is engaged with the sleeve by insertion of the gas supply tube through the nut, a thread groove is formed on an inner periphery of the other end of the nut, the thread groove is screwed to an outer peripheral thread groove formed on an opposite side of the flange portion of the metal short tube connected to the flange portion of the gas port portion, an end portion of the metal short tube on the opposite side of the flange portion thereof receives the sleeve through an O-ring to be fitted, the sleeve receives the gas introduction tube to be fitted, the sleeve engaged with the nut is bonded to the metal short tube side through the O-ring under pressure by screwing the nut to the metal short tube, and the gas supply tube is thereby connected to the gas introduction tube while keeping airtightness.

3. The vertical heat treatment apparatus according to claim 1, wherein a material of the gas introduction tube is quartz, and the gas introduction tube is covered with a protective tube made of silicon carbide.

4. The vertical heat treatment apparatus according to claim 2, wherein a material of the gas introduction tube is quartz, and the gas introduction tube is covered with a protective tube made of silicon carbide.

5. A heat treatment method comprising performing a heat treatment on a silicon wafer in a temperature range of 1000 to 1350° C. with the vertical heat treatment apparatus according to claim 1.

6. A heat treatment method for comprising performing a heat treatment on a silicon wafer in a temperature range of 1000 to 1350° C. with the vertical heat treatment apparatus according to claim 2.

7. A heat treatment method comprising performing a heat treatment on a silicon wafer in a temperature range of 1000 to 1350° C. with the vertical heat treatment apparatus according to claim 3.

8. A heat treatment method comprising performing a heat treatment on a silicon wafer in a temperature range of 1000 to 1350° C. with the vertical heat treatment apparatus according to claim 4.

* * * * *